US011316534B2

(12) United States Patent
Xu et al.

(10) Patent No.: US 11,316,534 B2
(45) Date of Patent: Apr. 26, 2022

(54) ENCODING METHOD AND DEVICE, DECODING METHOD AND DEVICE, AND STORAGE MEDIUM

(71) Applicant: ZTE CORPORATION, Shenzhen (CN)

(72) Inventors: Jin Xu, Shenzhen (CN); Jun Xu, Shenzhen (CN); Liguang Li, Shenzhen (CN)

(73) Assignee: XI'AN ZHONGXING NEW SOFTWARE CO., LTD., Shaanxi (CN)

( * ) Notice: Subject to any disclaimer, the term of this patent is extended or adjusted under 35 U.S.C. 154(b) by 554 days.

(21) Appl. No.: 16/325,030

(22) PCT Filed: Aug. 1, 2017

(86) PCT No.: PCT/CN2017/095474
§ 371 (c)(1),
(2) Date: Sep. 5, 2019

(87) PCT Pub. No.: WO2018/028474
PCT Pub. Date: Feb. 15, 2018

(65) Prior Publication Data

US 2021/0288667 A1 Sep. 16, 2021

(30) Foreign Application Priority Data

Aug. 12, 2016 (CN) ......................... 201610668564.1

(51) Int. Cl.
*H03M 13/00* (2006.01)
*H03M 13/11* (2006.01)
(Continued)

(52) U.S. Cl.
CPC ......... *H03M 13/1151* (2013.01); *G06F 7/405* (2013.01); *G06F 7/42* (2013.01);
(Continued)

(58) Field of Classification Search
CPC ......... H03M 13/1151; H03M 13/1102; H03M 13/1191; H03M 13/255; H03M 13/1105;
(Continued)

(56) References Cited

U.S. PATENT DOCUMENTS

2004/0255221 A1* 12/2004 Shen ..................... H04L 1/0058 714/752
2006/0015789 A1* 1/2006 Shin ..................... H04L 1/0066 714/746
(Continued)

FOREIGN PATENT DOCUMENTS

CN 102571105 A * 7/2012
CN 102571105 A 7/2012
CN 105429645 A * 3/2016
CN 105429645 A 3/2016

OTHER PUBLICATIONS

English Translation of International Search Report for International Application No. PCT/CN2017/095474 dated Sep. 13, 2017, 2 pages.

*Primary Examiner* — Albert Decady
*Assistant Examiner* — Osman M Alshack
(74) *Attorney, Agent, or Firm* — Cantor Colburn LLP

(57) ABSTRACT

Provided are an encoding method and device, a decoding method and device, and a storage medium. The encoding method comprises: encoding an initial to-be-encoded bit sequence with a low density parity check code LDPC having a code rate $R_1$, to obtain an encoded first bit sequence, where $0 \le R_1 \le 1$; linearly combining at least two bit sequence segments in the first bit sequence to obtain a second bit sequence; and cascading the first bit sequence and the second bit sequence to obtain a target bit sequence having a code rate $R_2$, where $0 \le R_2 \le R_1 \le 1$.

16 Claims, 6 Drawing Sheets

Encode an initial to-be-encoded bit sequence with a low density parity check code LDPC having a code rate $R_1$, to obtain an encoded first bit sequence, where $0 \leqslant R_1 \leqslant 1$ — S201

Linearly combine at least two bit sequence segments in the first bit sequence to obtain a second bit sequence — S203

Cascade the first bit sequence and the second bit sequence to obtain a target bit sequence having a code rate $R_2$, where $0 \le R_2 \le R_1 \le 1$ — S205

(51) Int. Cl.
*G06F 7/40* (2006.01)
*G06F 7/42* (2006.01)
*G06F 7/499* (2006.01)

(52) U.S. Cl.
CPC ..... *G06F 7/49947* (2013.01); *H03M 13/1105* (2013.01); *H03M 13/635* (2013.01)

(58) Field of Classification Search
CPC ... H03M 13/116; H03M 13/635; G06F 7/405; G06F 7/42; G06F 7/49947; G11B 2020/185
USPC .................................. 714/752, 776, 800–805
See application file for complete search history.

(56) References Cited

U.S. PATENT DOCUMENTS

| | | | | |
|---|---|---|---|---|
| 2009/0217124 | A1* | 8/2009 | Litsyn | G06F 11/1068 714/752 |
| 2014/0143640 | A1* | 5/2014 | Myung | H03M 13/1185 714/776 |
| 2015/0349997 | A1* | 12/2015 | Baek | H04L 1/0071 375/262 |
| 2015/0372694 | A1 | 12/2015 | Myung et al. | |
| 2016/0261369 | A1* | 9/2016 | Jeong | H04L 1/0041 |
| 2017/0324428 | A1* | 11/2017 | Li | H03M 13/1515 |
| 2018/0278370 | A1* | 9/2018 | Jeong | H03M 13/616 |

* cited by examiner

ENCODING METHOD AND DEVICE, DECODING METHOD AND DEVICE, AND STORAGE MEDIUM

CROSS-REFERENCE TO RELATED APPLICATION

This application is based upon and claims priority to PCT Application No. PCT/CN2017/095474 filed Aug. 1, 2017, which is based upon and claims priority to Chinese Patent Application No. 201610668564.1, filed Aug. 12, 2016, the entire contents of which are incorporated herein by reference.

TECHNICAL FIELD

The present disclosure relates to the field of communication, and more particularly to an encoding method and device, a decoding method and device, and a storage medium.

BACKGROUND

The transmitting end of the digital communication system usually includes a source, a channel encoder and a modulator, and the receiving end usually includes a demodulator, a channel decoder and a destination, as shown in FIG. 1. The channel encoder is configured to introduce redundant information into original information according to a certain rule, so that the channel decoder at the receiving end can correct to some extent the errors occurring when the information is transmitted on the channel.

Low Density Parity Check Code (LDPC) is a linear block code based on a sparse check matrix, which utilizes the sparsity of its check matrix to achieve encoding and decoding of low complexity. This makes the LDPC code practical.

The graphical representation of the LDPC parity check matrix is a bipartite graph. There is a one-to-one correspondence between the bipartite graph and the check matrix. One M*N parity check matrix H defines a constraint that each codeword having N bits satisfies M parity checks. One bipartite graph includes N variable nodes and M parity check nodes. When the m-th check involves the n-th bit, that is, the element $H_m$ of the m-th row and the n-th column in H, n=1, there will be a edge between the check node m and the variable node n. In the bipartite graph, there is no connection between any variable nodes or between any check nodes, and the total number of edges in the bipartite graph is equal to the number of non-zero elements in the check matrix.

A special type of LDPC code has become a major application due to its structured features. For example, a LDPC parity check matrix H with size of (M×z)×(N×z) is composed of M×N block matrices. Each block matrix is a different power of a z×z basic permutation matrix. where the basic permutation matrices are all cyclic shift matrices of the unit matrix (right shift in default herein) with following form:

$$H = \begin{bmatrix} P^{h_{00}^b} & P^{h_{01}^b} & P^{h_{02}^b} & \dots & P^{h_{0n_b}^b} \\ P^{h_{10}^b} & P^{h_{11}^b} & P^{h_{12}^b} & \dots & P^{h_{1n_b}^b} \\ \dots & \dots & \dots & \dots & \dots \\ P^{h_{m_b0}^b} & P^{h_{m_b1}^b} & P^{h_{m_b2}^b} & \dots & P^{h_{m_bn_b}^b} \end{bmatrix} = P^{H_b}$$

If $h_{ij}^b=-1$, then $P^{h_{ij}^b}=0$

If $h_{ij}^b$ is an integer greater than or equal to 0, define $P^{h_{ij}^b}=(P)^{h_{ij}^b}$, where P is a z×z standard permutation matrix, as follows:

$$P = \begin{bmatrix} 0 & 1 & 0 & \dots & 0 \\ 0 & 0 & 1 & \dots & 0 \\ \dots & \dots & \dots & \dots & \dots \\ 0 & 0 & 0 & \dots & 1 \\ 1 & 0 & 0 & \dots & 0 \end{bmatrix}$$

Each of these block matrices can be uniquely identified by such a power $h_{ij}^b$. If the matrix is zero matrix, the $h_{ij}^b$ is usually represented by −1. Thus, if each block matrix of H is replaced by its power, a M×N matrix $H_b$ is obtained. Here, it is defined that $H_b$ is the basic matrix of H, and H is referred to as the extension matrix of $H_b$. In actual encoding, z=code length/number N of columns of the base matrix, which is referred to as a lifting factor.

For example, a matrix is as follows:

$$H = \left[\begin{array}{ccc|ccc|ccc|ccc} 1 & 0 & 0 & 0 & 1 & 0 & 1 & 0 & 0 & 0 & 0 & 0 \\ 0 & 1 & 0 & 0 & 0 & 1 & 0 & 1 & 0 & 0 & 0 & 0 \\ 0 & 0 & 1 & 1 & 0 & 0 & 0 & 0 & 1 & 0 & 0 & 0 \\ \hline 0 & 0 & 1 & 0 & 1 & 0 & 0 & 0 & 1 & 0 & 1 & 0 \\ 1 & 0 & 0 & 0 & 0 & 1 & 1 & 0 & 0 & 0 & 0 & 1 \\ 0 & 1 & 0 & 1 & 0 & 0 & 0 & 1 & 0 & 1 & 0 & 0 \end{array}\right]$$

It can be extended with the following parameter z and a 2×4 base matrix $H_b$:

$$z = 3 \text{ and } H_b = \begin{bmatrix} 0 & 1 & 0 & -1 \\ 2 & 1 & 2 & 1 \end{bmatrix}$$

Therefore, it can also be said that the encoder of such an LDPC code is uniquely generated by the base matrix $H_b$, the spreading factor z and the selected basic permutation matrix.

The code rate of the LDPC code is related to the size of the parity check matrix or the base matrix. For example, the LDPC code rate corresponding to a base matrix of M rows and N columns is R=(N−M)/N.

For example, a matrix 1

| | | | | | | | | | | | |
|---|---|---|---|---|---|---|---|---|---|---|---|
| 0 | 0 | 0 | 0 | 0 | 0 | 0 | 0 | 0 | −1 | −1 | −1 |
| 464 | 63 | 153 | 53 | 476 | 176 | 18 | 243 | 430 | 0 | −1 | −1 |
| 167 | 26 | 131 | 438 | 345 | 498 | 251 | 371 | −1 | 280 | 0 | −1 |
| 128 | 363 | 443 | 285 | 316 | 69 | 473 | 22 | −1 | −1 | 455 | 0 |

is a basic matrix of 4 rows and 12 columns, the code rate of the LDPC code corresponding to the matrix is 2/3;

a matrix 2

| | | | | | | | | | | | | | | | |
|---|---|---|---|---|---|---|---|---|---|---|---|---|---|---|---|
| 0 | 0 | 0 | 0 | 0 | 0 | 0 | 0 | 0 | −1 | −1 | −1 | −1 | −1 | −1 | −1 |
| 232 | 31 | 76 | 26 | 238 | 88 | 9 | 121 | 215 | 0 | −1 | −1 | −1 | −1 | −1 | −1 |
| 83 | 13 | 65 | 219 | 172 | 249 | 125 | 185 | −1 | 140 | 0 | −1 | −1 | −1 | −1 | −1 |
| 64 | 181 | 221 | 142 | 157 | 34 | 236 | 11 | −1 | −1 | 227 | 0 | −1 | −1 | −1 | −1 |
| 227 | 77 | 232 | −1 | 10 | −1 | 99 | −1 | −1 | −1 | −1 | 136 | 0 | −1 | −1 | −1 |
| 70 | 219 | 104 | −1 | −1 | 91 | −1 | −1 | −1 | −1 | −1 | −1 | −1 | 0 | −1 | −1 |
| 7 | 165 | −1 | 110 | −1 | 203 | −1 | −1 | −1 | −1 | −1 | −1 | −1 | −1 | 0 | −1 |
| 109 | 161 | −1 | 193 | 7 | −1 | 64 | −1 | −1 | −1 | −1 | −1 | −1 | −1 | −1 | 0 |

is a basic matrix of 8 rows and 16 columns, the code rate of the LDPC code corresponding to the matrix is 1/2;

a matrix 3

| | | | | | | | | | | | | | | | | | | | | | | | |
|---|---|---|---|---|---|---|---|---|---|---|---|---|---|---|---|---|---|---|---|---|---|---|---|
| 0 | 0 | 0 | 0 | 0 | 0 | 0 | 0 | 0 | −1 | −1 | −1 | −1 | −1 | −1 | −1 | −1 | −1 | −1 | −1 | −1 | −1 | −1 | −1 |
| 928 | 126 | 306 | 106 | 952 | 352 | 36 | 486 | 860 | 0 | −1 | −1 | −1 | −1 | −1 | −1 | −1 | −1 | −1 | −1 | −1 | −1 | −1 | −1 |
| 335 | 52 | 262 | 876 | 690 | 996 | 502 | 742 | −1 | 561 | 0 | −1 | −1 | −1 | −1 | −1 | −1 | −1 | −1 | −1 | −1 | −1 | −1 | −1 |
| 256 | 726 | 886 | 570 | 630 | 138 | 946 | 44 | −1 | −1 | 911 | 0 | −1 | −1 | −1 | −1 | −1 | −1 | −1 | −1 | −1 | −1 | −1 | −1 |
| 910 | 310 | 928 | −1 | 40 | −1 | 396 | −1 | −1 | −1 | −1 | 544 | 0 | −1 | −1 | −1 | −1 | −1 | −1 | −1 | −1 | −1 | −1 | −1 |
| 280 | 876 | 418 | −1 | −1 | 365 | −1 | −1 | −1 | −1 | −1 | −1 | −1 | 0 | −1 | −1 | −1 | −1 | −1 | −1 | −1 | −1 | −1 | −1 |
| 28 | 660 | −1 | 442 | −1 | 814 | −1 | −1 | −1 | −1 | −1 | −1 | −1 | −1 | 0 | −1 | −1 | −1 | −1 | −1 | −1 | −1 | −1 | −1 |
| 438 | 646 | −1 | 772 | 30 | −1 | 257 | −1 | −1 | −1 | −1 | −1 | −1 | −1 | −1 | 0 | −1 | −1 | −1 | −1 | −1 | −1 | −1 | −1 |
| 420 | 768 | −1 | −1 | −1 | 330 | −1 | −1 | 609 | −1 | −1 | −1 | −1 | −1 | −1 | −1 | 0 | −1 | −1 | −1 | −1 | −1 | −1 | −1 |
| 136 | 936 | −1 | −1 | −1 | −1 | −1 | −1 | −1 | 71 | −1 | −1 | −1 | −1 | −1 | −1 | −1 | 0 | −1 | −1 | −1 | −1 | −1 | −1 |
| 148 | 40 | 382 | −1 | −1 | −1 | −1 | −1 | −1 | −1 | 284 | −1 | −1 | −1 | −1 | −1 | −1 | −1 | 0 | −1 | −1 | −1 | −1 | −1 |
| 486 | 928 | −1 | 399 | −1 | −1 | −1 | −1 | −1 | −1 | −1 | −1 | −1 | −1 | −1 | −1 | −1 | −1 | −1 | 0 | −1 | −1 | −1 | −1 |
| 781 | 400 | −1 | −1 | 618 | −1 | 296 | −1 | −1 | −1 | −1 | −1 | −1 | −1 | −1 | −1 | −1 | −1 | −1 | −1 | 0 | −1 | −1 | −1 |
| 290 | 606 | −1 | −1 | −1 | 418 | −1 | 748 | −1 | −1 | −1 | −1 | −1 | −1 | −1 | −1 | −1 | −1 | −1 | −1 | −1 | 0 | −1 | −1 |
| 502 | 420 | −1 | −1 | −1 | −1 | 705 | −1 | −1 | −1 | −1 | −1 | −1 | −1 | −1 | −1 | −1 | −1 | −1 | −1 | −1 | −1 | 0 | −1 |
| 756 | 100 | −1 | −1 | −1 | −1 | −1 | 977 | −1 | −1 | −1 | −1 | −1 | −1 | −1 | −1 | −1 | −1 | −1 | −1 | −1 | −1 | −1 | 0 |

is a basic matrix of 16 rows and 24 columns, and the code rate of the LDPC code corresponding to the matrix is 1/3. It can be seen that the parity check matrix or base matrix of a low code rate LDPC code usually requires a larger number M of rows.

There are many decoding algorithms for LDPC codes. Among them, Message Passing algorithm or Belief Propagation algorithm (BP algorithm) are the mainstream and basic algorithms of LDPC codes. At present, there are many improved effective decoding algorithms. A decoding algorithm frequently used by industry is Layered Belief Propagation algorithm (Layered-BP algorithm). The Layered-BP algorithm has the advantages of less iterations and faster convergence. However, the hardware delay of the decoder based on the Layered-BP algorithm is related to the code rate of the parity check matrix or the base matrix. The lower the code rate is, the more rows of the matrix requires, the smaller the parallelism is, the larger delay is and the lower throughput is. There is also a typical decoding algorithm called full parallel decoding algorithm. The full parallel decoding algorithm has the advantages of high parallelism, small delay and high throughput, but the complexity of the decoder hardware based on the full parallel algorithm is also related to the code rate of the parity check matrix or the base matrix. The lower the code rate is, the larger the matrix is, the higher hardware complexity is, and the more difficult the hardware implementation is.

As can be seen from the above description, although increasing the number of rows of the parity check matrix or the basic matrix of the LDPC code can obtain a lower encoding rate, this will also increase the decoding delay or complexity of the decoder.

At present, there is no feasible solution at present for the problem in the related art that low code rate LDPC encoding will increase the decoding delay and hardware complexity of the decoder.

SUMMARY

The embodiments of the present disclosure provide an encoding method and device, a decoding method and device, and a storage medium, so as to at least solve the problem in the related art that code rate LDPC encoding will increase the decoding delay and hardware complexity of the decoder.

According to an embodiment of the present disclosure, an encoding method is provided, including:

encoding an initial bit sequence to be encoded with a low density parity check code LDPC having a code rate $R_1$, to obtain an encoded first bit sequence, where $0 \le R_1 \le 1$;

linearly combining at least two bit sequence segments in the first bit sequence to obtain a second bit sequence; and cascading the first bit sequence and the second bit sequence to obtain a target bit sequence having a code rate $R_2$, where $0 \le R_2 \le R_1 \le 1$.

Optionally, before linearly combining at least two bit sequence segments in the first bit sequence to obtain a second bit sequence, the method further includes:

dividing the first bit sequence into t bit sequence segments, where a relationship exists between the number t of the bit sequence segments and the code rate $R_1$:

$$t = \left[\!\left[ \frac{j}{R_1} \right]\!\right],$$

where t is a positive integer greater than or equal to 1, j is a positive integer, and the operator $[\![\cdot]\!]$ represents a rounding operation.

Optionally, linearly combining at least two bit sequence segments in the first bit sequence to obtain a second bit sequence includes:

a selecting step of selecting $t_1$ bit sequence segments from t bit sequence segments;

a determining step of linearly combining bits at corresponding positions in the $t_1$ bit sequence segments to obtain a bit sequence segment $D_1$, where $1<t_1\leq t$;

repeating the selecting step and the determining step to generate w bit sequence segments $\{D_1, D_2, \ldots, D_w\}$, where w is a positive integer; and a cascading step of cascading the w bit sequence segments to obtain the second bit sequence.

Optionally, linearly combining bits at corresponding positions in the $t_1$ bit sequence segments includes at least one of:

performing binary addition of the bits at corresponding positions in the $t_1$ bit sequence segments; and first performing interleaving on at least two bit sequence segments of the $t_1$ bit sequence segments, and then performing binary addition of the bits at corresponding positions in the $t_1$ bit sequence segments.

Optionally, selecting $t_1$ bit sequence segments from t bit sequence segments includes at least one of:

performing selection according to a pre-determined rule between an encoding end and a decoding end;

performing selection according to an indication in a signal sent from the encoding end to the decoding end; and performing selection according to an indication in a signal sent from the decoding end to the encoding end.

Optionally, the number w of bit sequence segments is determined according to t, $R_1$, and $R_2$.

Optionally, the number w of bit sequence segments of the second bit sequence is determined according to a formula of:

$$w = \left[\!\left[ t \cdot \left( \frac{R_1}{R_2} - 1 \right) \right]\!\right],$$

where, the operator $[\![\cdot]\!]$ represents a rounding operation.

Optionally, a bit length $L_2$ of the second bit sequence is determined according to $L_1$, $R_1$, and $R_2$, wherein $L_1$ is a bit length of the first bit sequence.

Optionally, the bit length $L_2$ of the second bit sequence is determined according to a formula of:

$$L_2 = \left[\!\left[ L_1 \cdot \left( \frac{R_1}{R_2} - 1 \right) \right]\!\right],$$

where, the operator $[\![\cdot]\!]$ represents a rounding operation.

Optionally, when $R_1=1/3$, $R_2=1/5$, and the first bit sequence includes 3 bit sequence segments {P1, P2, P3}, the method further includes:

linearly combining the bit sequence segments P1 and P2, and linearly combining the bit sequence segments P1 and P3 to obtain a second bit sequence; and cascading the first bit sequence and the second bit sequence to obtain a target bit sequence having a code rate $R_2=1/5$.

According to another aspect of the present disclosure, a decoding method is provided, including: decoding a target bit sequence of code rate $R_2$ with a low density parity check code LDPC of code rate $R_1$, to obtain an initial bit sequence to be encoded, where $0\leq R_2\leq R_1\leq 1$, wherein the target bit sequence is formed by cascading a first bit sequence and a second bit sequence, the first bit sequence is obtained by encoding an initial bit sequence to be encoded with a LDPC having a code rate $R_1$, and the second bit sequence is obtained by linearly combining at least two bit sequence segments in the first bit sequence.

According to another embodiment of the present disclosure, an encoding device is provided, including:

a first encoding module configured to encode an initial bit sequence to be encoded with a low density parity check code LDPC having a code rate $R_1$, to obtain an encoded first bit sequence, where $0\leq R_1\leq 1$;

a second encoding module configured to linearly combine at least two bit sequence segments in the first bit sequence to obtain a second bit sequence; and a third encoding module configured to cascade the first bit sequence and the second bit sequence to obtain a target bit sequence having a code rate $R_2$, where $0\leq R_2\leq R_1\leq 1$.

Optionally, the second encoding module is further configured to divide the first bit sequence into t bit sequence segments, where a relationship exists between the number t of the bit sequence segments and the code rate $R_1$:

$$t = \left[\!\left[ \frac{j}{R_1} \right]\!\right],$$

where t is a positive integer greater than or equal to 1, j is a positive integer, and the operator $[\![\cdot]\!]$ represents a rounding operation.

Optionally, the second encoding module includes:

a selection unit configured to select $t_1$ bit sequence segments from t bit sequence segments of the first bit sequence;

a combining unit configured to linearly combine bits at corresponding positions in the $t_1$ bit sequence segments to obtain a bit sequence segment $D_1$, where $1<t_1\leq t$; and a cascading unit configured to cascade the w bit sequence segments $\{D_1, D_2, \ldots, D_w\}$ generated by the selection unit and the combining unit to obtain the second bit sequence, where w is a positive integer.

Optionally, the combining unit is further configured to perform at least one of:

performing binary addition of the bits at corresponding positions in the $t_1$ bit sequence segments; and first performing interleaving on at least two bit sequence segments of the $t_1$ bit sequence segments, and then performing binary addition of the bits at corresponding positions in the $t_1$ bit sequence segments.

Optionally, the combining unit is further configured to:

according to a pre-determined rule between an encoding end and a decoding end, select $t_1$ bit sequence segments from t bit sequence segments;

according to an indication in a signal sent from the encoding end to the decoding end, select $t_1$ bit sequence segments from t bit sequence segments; and according to an indication in a signal sent from the decoding end to the encoding end, select $t_1$ bit sequence segments from t bit sequence segments.

Optionally, the number w of bit sequence segments of the second bit sequence is determined according to t, $R_1$, and $R_2$.

Optionally, the number w of bit sequence segments of the second bit sequence is determined according to a formula of:

$$w = \left[\!\left[ t \cdot \left( \frac{R_1}{R_2} - 1 \right) \right]\!\right],$$

where, the operator $[\![\cdot]\!]$ represents a rounding operation.

Optionally, a bit length $L_2$ of the second bit sequence is determined according to $L_1$, $R_1$, and $R_2$, wherein $L_1$ is a bit length of the first bit sequence.

Optionally, the bit length $L_2$ of the second bit sequence is determined according to a formula of:

$$L_2 = \left[\!\left[ L_1 \cdot \left( \frac{R_1}{R_2} - 1 \right) \right]\!\right],$$

where, the operator $[\![\cdot]\!]$ represents a rounding operation.

Optionally, when $R_1=1/3$, $R_2=1/5$, and the first bit sequence includes 3 bit sequence segments {P1, P2, P3}, the combining unit is further configured to linearly combine the bit sequence segments P1 and P2, and linearly combine the bit sequence segments P1 and P3 to obtain a second bit sequence; and the cascading unit is further configured to cascade the first bit sequence and the second bit sequence to obtain a target bit sequence having a code rate $R_2=1/5$.

According to another embodiment of the present disclosure, a decoding device is provided, including:

a decoding module configured to decode a target bit sequence having a code rate $R_2$ with a low density parity check code LDPC having a code rate $R_1$, where $0 \le R_2 \le R_1 \le 1$, wherein the target bit sequence is formed by cascading a first bit sequence and a second bit sequence, the first bit sequence is obtained by encoding an initial bit sequence to be encoded with a LDPC having a code rate $R_1$, and the second bit sequence is obtained by linearly combining at least two bit sequence segments in the first bit sequence.

According to another embodiment of the present disclosure, an encoding device is provided, including a first processor and a first memory configured to store instructions executable by the first processor, wherein when the instructions are executed by the first processor, the first processor is configured to perform:

encoding an initial bit sequence to be encoded with a low density parity check code LDPC having a code rate $R_1$, to obtain an encoded first bit sequence, where $0 \le R_1 \le 1$;

linearly combining at least two bit sequence segments in the first bit sequence to obtain a second bit sequence; and cascading the first bit sequence and the second bit sequence to obtain a target bit sequence having a code rate $R_2$, where $0 \le R_2 < R_1 < 1$.

Optionally, before linearly combining at least two bit sequence segments in the first bit sequence to obtain a second bit sequence, the first processor is further configured to perform:

dividing the first bit sequence into t bit sequence segments, where a relationship exists between the number t of the bit sequence segments and the code rate $R_1$:

$$t = \left[\!\left[ \frac{j}{R_1} \right]\!\right],$$

where t is a positive integer greater than or equal to 1, j is a positive integer, and the operator $[\![\cdot]\!]$ represents a rounding operation.

Optionally, the first processor is further configured to perform:

a selecting step of selecting $t_1$ bit sequence segments from t bit sequence segments;

a combining step of linearly combining bits at corresponding positions in the $t_1$ bit sequence segments to obtain a bit sequence segment $D_1$, where $1 < t_1 \le t$;

repeating the selecting step and the combining step to generate w bit sequence segments $\{D_1, D_2, \ldots, D_w\}$, where w is a positive integer; and cascading the w bit sequence segments to obtain the second bit sequence.

Optionally, the first processor selecting t1 bit sequence segments from t bit sequence segments of the first bit sequence includes an operation of at least one of:

performing selection according to a pre-determined rule between an encoding end and a decoding end;

performing selection according to an indication in a signal sent from the encoding end to the decoding end; and performing selection according to an indication in a signal sent from the decoding end to the encoding end.

According to another embodiment of the present disclosure, a decoding device is provided, including a second processor and a second memory configured to store instructions executable by the second processor, wherein when the instructions are executed by the second processor, the second processor is configured to perform operations of:

decoding a target bit sequence having a code rate $R_2$ with a low density parity check code LDPC having a code rate $R_1$, to obtain an initial bit sequence to be encoded, where $0 \le R_2 \le R_1 \le 1$, wherein the target bit sequence is formed by cascading a first bit sequence and a second bit sequence, the first bit sequence is obtained by encoding an initial bit sequence to be encoded with a LDPC having a code rate $R_1$, and the second bit sequence is obtained by linearly combining at least two bit sequence segments in the first bit sequence.

According to another embodiment of the present disclosure, a storage medium is provided. The computer storage medium may store execution instructions for performing the implementation of the encoding method or the decoding method in the above embodiments.

Through the embodiments of the present disclosure, the initial bit sequence is encoded with the LDPC of a low code rate $R_1$, to obtain a first bit sequence, and the first bit sequence is segmented. Then, at least two bit sequence segments in the first bit sequence are combined linearly to obtain a second bit sequence. The first bit sequence and the second bit sequence are cascaded to obtain a target bit sequence of a lower code rate $R_2$, where $0 \le R_2 \le R_1 \le 1$. In this way, during the transmission of the target bit sequence, the code rate $R_2$ is lower, it can ensure the propagation speed. In the decoding stage, since the target bit sequence is obtained by cascading the first bit sequence and the second bit sequence, the decoder can directly decode with the LDPC of the code rate $R_1$. Therefore, the present disclosure can solve the problem in the related art that low code rate LDPC encoding will increase the decoding delay and hardware complexity of the decoder, and the decoding delay and hardware complexity of the decoder won't be increased while obtaining a LDPC encoding of a low code rate.

BRIEF DESCRIPTION OF THE DRAWINGS

The accompanying drawings described herein are intended to provide a further understanding of the present disclosure, and are intended to be a part of the present disclosure. The illustrative embodiments of the present disclosure and the description thereof are for explaining the present disclosure and do not constitute an undue limitation of the present invention. In the drawings.

DETAILED DESCRIPTION

The present disclosure will be described in detail below with reference to the drawings in conjunction with the embodiments. It should be noted that the embodiments in the present application and the features in the embodiments may be combined with each other if these features or embodiment do not conflict with each other.

It is to be understood that the terms "first", "second", and the like in the specification and claims of the present disclosure are used to distinguish similar objects, and are not necessarily used to describe a particular order or sequence. It is to be understood that the numbers used in such way may be interchanged where appropriate, so that the embodiments of the present disclosure described herein can be implemented in a sequence other than those illustrated or described herein. In addition, the terms "include" and "have" and any variations thereof are intended to cover non-exclusive inclusions. For example, a process, a method, a system, a product, or a device that includes a series of steps or units is not necessarily limited to those steps or units that are clearly listed, but may include other steps or units that are not clearly listed or inherent to the process, the method, or the device.

First Embodiment

According to an embodiment of the present disclosure, an encoding method embodiment is provided. It should be noted that the steps illustrated in the flowchart of the figures may be performed in a computer system such as a set of computer executable instructions. Although a logical order is shown in the flowchart, but in some cases the steps shown or described may be performed in a different order than the ones described herein.

Figure 1:
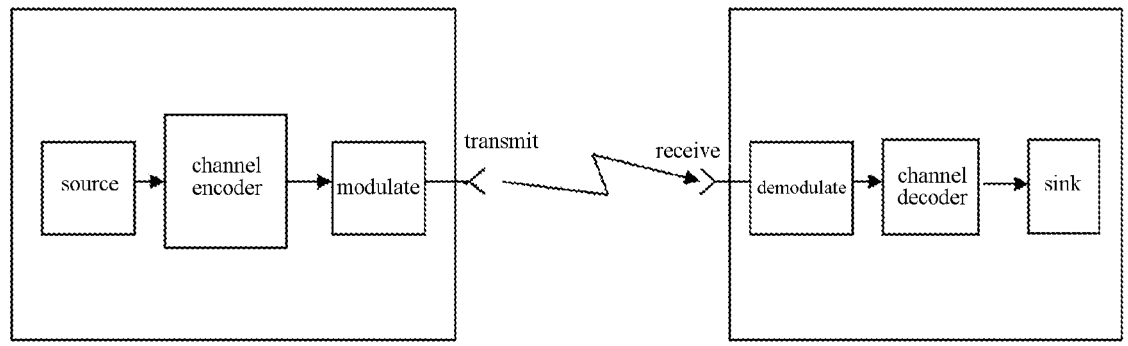
FIG. 1 is a topological diagram of a transmitting end and a receiving end of a communication system in the related art.
Figure 2:
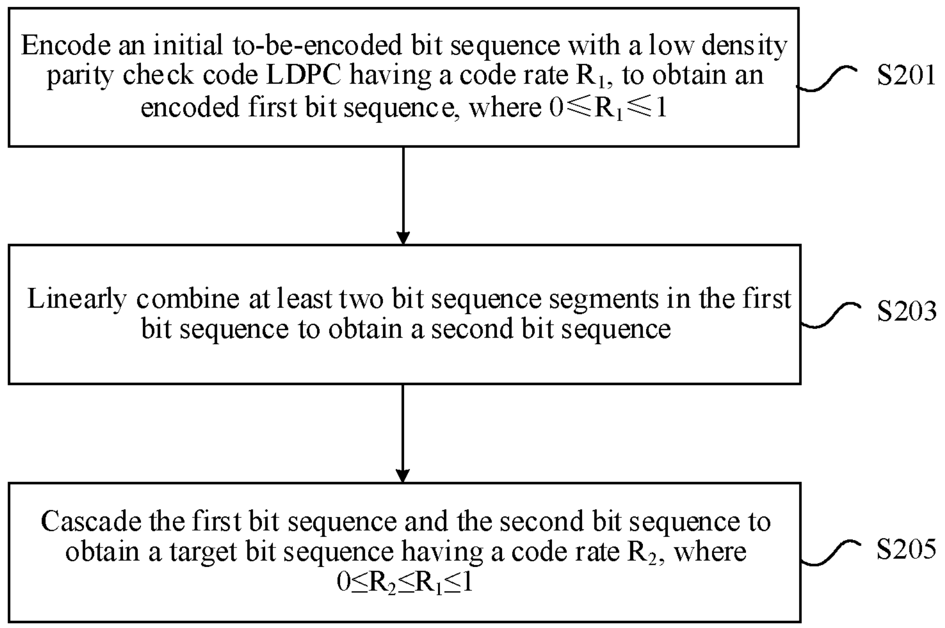
FIG. 2 is a flowchart of an encoding method according to a first embodiment of the present disclosure.

FIG. 2 is a flow chart of an encoding method according to the first embodiment of the present disclosure. As shown in FIG. 2, this embodiment provides an encoding method, including the following steps.

In S201, an initial bit sequence to be encoded is encoded with a low density parity check code LDPC having a code rate $R_1$, to obtain an encoded first bit sequence, where $0 \le R_1 \le 1$.

In S203, at least two bit sequence segments in the first bit sequence are combined linearly to obtain a second bit sequence.

In S205, the first bit sequence and the second bit sequence are cascaded to obtain a target bit sequence having a code rate $R_2$, where $0 \le R_2 \le R_1 \le 1$.

Through the above steps, the initial bit sequence is encoded with the LDPC of a low code rate $R_1$, to obtain a first bit sequence, and the first bit sequence is segmented. Then, at least two bit sequence segments in the first bit sequence are combined linearly to obtain a second bit sequence. The first bit sequence and the second bit sequence are cascaded to obtain a target bit sequence of a lower code rate $R_2$, where $0 \le R_2 \le R_1 \le 1$. In this way, during the transmission of the target bit sequence, the code rate $R_2$ is lower, this can ensure the propagation speed. In the decoding stage, since the target bit sequence is obtained by cascading the first bit sequence and the second bit sequence, the decoder can directly decode with the LDPC of the code rate $R_1$. Therefore, the embodiment can solve the problem in the related art that low code rate LDPC encoding will increase the decoding delay and hardware complexity of the decoder, and the decoding delay and hardware complexity of the decoder won't be increased while obtaining a LDPC encoding of a low code rate.

In an exemplary solution of this embodiment, before at least two bit sequence segments in the first bit sequence are combined linearly to obtain a second bit sequence, the first bit sequence is first divided into t bit sequence segments, where there is a relationship between the number t of the bit sequence segments and the code rate $R_1$ as follows:

$$t = [\![ \frac{j}{R_1} ]\!],$$

where t is a positive integer greater than or equal to 1, j is a positive integer, and the operator ⌈·⌉ represents rounding up, rounding down, or rounding operation.

In another exemplary implementation of this embodiment, combining linearly at least two bit sequence segments in the first bit sequence to obtain a second bit sequence specifically includes the following steps.

In a selecting step, $t_1$ bit sequence segments are selected from t bit sequence segments.

In a determining step: bits at corresponding positions are linearly combined to the $t_1$ bit sequence segments to obtain a bit sequence segment $D_1$, where $1<t_1\leq t$.

The above selecting step and determining step are repeated to generate w bit sequence segments $\{D_1, D_2, \ldots, D_w\}$, where w is a positive integer.

In a cascading step: the w bit sequence segments are cascaded to obtain the second bit sequence.

It should be noted that the linear combination of the bits at the corresponding positions in the $t_1$ bit sequence segments in the determining step may be implemented by any of the following manners:

performing binary addition of the bits at corresponding positions in the $t_1$ bit sequence segments; or first performing interleaving on at least two bit sequence segments of the $t_1$ bit sequence segments, and then performing binary addition of the bits at corresponding positions in the $t_1$ bit sequence segments.

However, the linear combination of the bits at the corresponding positions in the bit sequence segment can be implemented by other manners. Any equivalent substitution or extension on the basis of the embodiment is within the protection scope of the embodiment, which is not limited in the embodiment.

In another exemplary solution of the present disclosure, how to select $t_1$ bit sequence segments and which bit sequence segments are selected from the t bit sequence segments of the first bit sequence are specifically described, including but not limited to the following manners.

The selection may be performed according to a predetermined rule between the encoding end and the decoding end, or may be performed according to an indication in a signal sent from the encoding end to the decoding end, or may be performed according to an instruction in a signal sent from the decoding end to the encoding end.

The number w of bit sequence segments mentioned in the embodiment is determined according to t, $R_1$, and $R_2$. It may be determined according to the following formula:

$$w=\left[\!\left[t\cdot\left(\frac{R_1}{R_2}-1\right)\right]\!\right],$$

where, the operator ⟦·⟧ represents a rounding operation.

The bit length $L_2$ of the second bit sequence mentioned in this embodiment is determined according to $L_1$, $R_1$, and $R_2$, and is specifically determined according to the following formula:

$$L_2=\left[\!\left[L_1\cdot\left(\frac{R_1}{R_2}-1\right)\right]\!\right],$$

where $L_1$ denotes the bit length of the first bit sequence, and the operator ⟦·⟧ represents a rounding operation.

In an exemplary solution of the embodiment, a bit sequence O to be decoded may be encoded with an LDPC code having a code rate of 1/3 to obtain an encoded bit sequence P. Then, the bit sequence P is divided into three bit sequence segments {P1, P2, P3}. After that, the bit sequence segments P1 and P2 are linearly combined, and the bit sequence segments P1 and P3 are linearly combined to obtain a bit sequence Q; the bit sequence P and the bit sequence Q are cascaded to obtain a bit sequence S having a code rate of 1/5.

It can be seen from the above exemplary embodiment that during the transmission of the bit sequence S, the code rate is 1/5, which can ensure the propagation speed. In the decoding stage, since the bit sequence S is obtained by cascading the bit sequence P and the bit sequence Q, the decoder can directly decode the sequence with the LDPC having a code rate of 1/3. Therefore, the embodiment can solve the problem in the related art that low code rate LDPC encoding will increase the decoding delay and hardware complexity of the decoder, and thus the decoding delay and hardware complexity of the decoder won't be increased while obtaining a LDPC encoding of a low code rate.

It should be noted that the above encoding method may be performed by an encoder, or may be another device having an encoding function, which is not limited in this embodiment.

Figure 3:
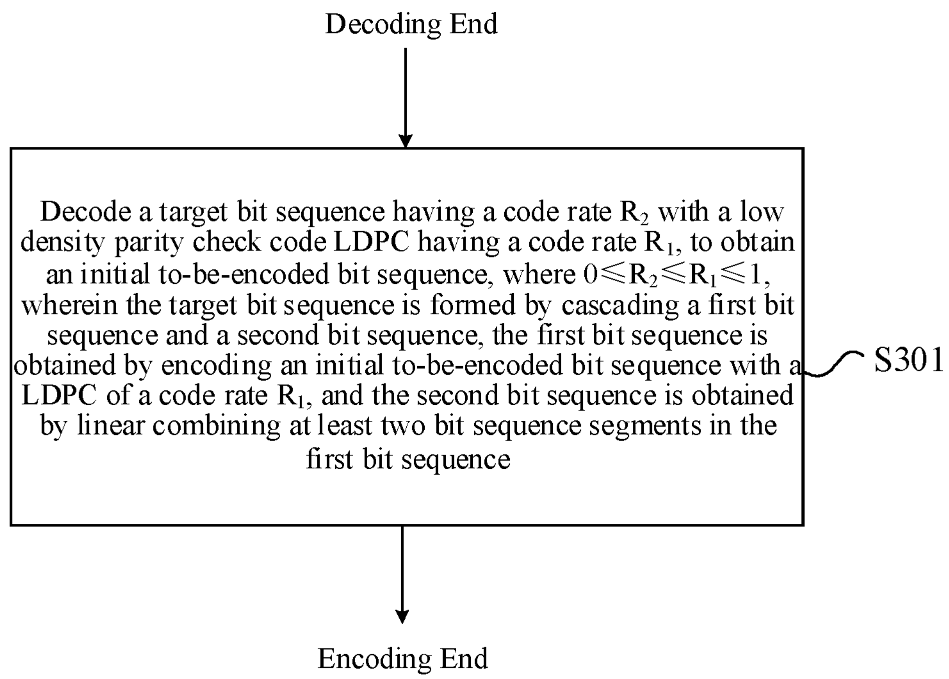
FIG. 3 is a flowchart of a decoding method according to the first embodiment of the present disclosure.

In order to better understand the present disclosure, this embodiment also provides a decoding method. FIG. 3 is a flowchart of a decoding method according to the first embodiment of the present disclosure. As shown in FIG. 3, the decoding method includes the following steps.

In S301, a target bit sequence having a code rate $R_2$ is decoded with a low density parity check code LDPC having a code rate $R_1$, to obtain an initial bit sequence to be encoded, where $0\leq R_2\leq R_1\leq 1$.

The target bit sequence is formed by cascading a first bit sequence and a second bit sequence.

The first bit sequence is obtained by encoding an initial bit sequence to be encoded with a LDPC having a code rate $R_1$.

The second bit sequence is obtained by linearly combining at least two bit sequence segments in the first bit sequence.

Through the above steps, a target bit sequence having a code rate $R_2$ is decoded with a low density parity check code LDPC having a code rate $R_1$, where $0\leq R_2\leq R_1\leq 1$, the target bit sequence is formed by cascading a first bit sequence and a second bit sequence; the first bit sequence is obtained by encoding an initial bit sequence to be encoded with a LDPC having a code rate $R_1$; and the second bit sequence is obtained by linearly combining at least two bit sequence segments in the first bit sequence. Since the target bit sequence is obtained by cascading the first bit sequence and the second bit sequence, the decoder can directly decode with the LDPC of the code rate $R_1$. Therefore, the present embodiment can solve the problem in the related art that low code rate LDPC encoding will increase the decoding delay and hardware complexity of the decoder, and thus the present embodiment can achieve an effect that the decoding delay and hardware complexity of the decoder won't be increased while obtaining a LDPC encoding of a low code rate.

It should be noted that the above decoding method may be performed by an decoder, or may be another device having an decoding function, which is not limited in this embodiment.

Through the description of the above embodiments, those skilled in the art can clearly understand that the methods according to the above embodiments can be implemented by means of software in combination with a necessary general hardware platform, and of course, can be implemented in hardware. But in many cases, the former is a better implementation. Based on such understanding, the technical solutions of the present disclosure, in essence or with a part contributing to the prior art, may be embodied in the form of a software product stored in a storage medium (such as a ROM/RAM, a magnetic disk, an optical disc) including instructions for causing a terminal device (which may be a cell phone, a computer, a server, or a network device, etc.) to perform the methods of various embodiments of the present disclosure.

Second Embodiment

In this embodiment, an encoding device is provided, which is applied to an encoding apparatus, and is configured to implement the above embodiments and exemplary implementations. As used below, the term "module" may implement a combination of software and/or hardware of a predetermined function. Although the devices described in the following embodiments are preferably implemented in software, hardware or a combination of software and hardware is also possible and can be contemplated.

Figure 4:
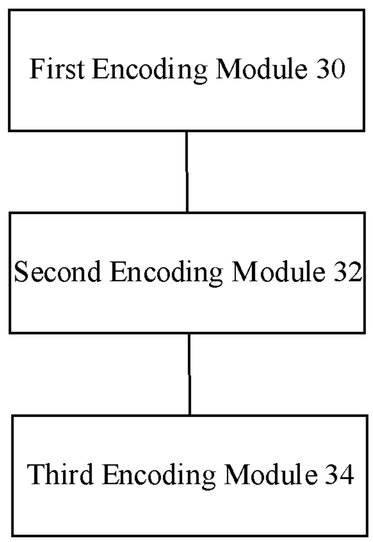
FIG. 4 is a first block diagram showing the structure of an encoding device according to a second embodiment of the present disclosure.

FIG. 4 is a first block diagram showing the structure of an encoding device according to a second embodiment of the present disclosure. As shown in FIG. 4, the encoding device includes the following modules.

A first encoding module 40 is configured to encode an initial bit sequence to be encoded with a low density parity check code LDPC having a code rate $R_1$, to obtain an encoded first bit sequence, where $0 \le R_1 \le 1$.

A second encoding module 42 is connected to the first encoding module 30, and is configured to linearly combine at least two bit sequence segments in the first bit sequence to obtain a second bit sequence.

A third encoding module 44 is connected to the second encoding module 32, and is configured to cascade the first bit sequence and the second bit sequence to obtain a target bit sequence having a code rate $R_2$, where $0 \le R_2 \le R_1 \le 1$.

Through the above encoding device, the first encoding module 40 encodes an initial bit sequence to be encoded with a low density parity check code LDPC having a code rate $R_1$, to obtain an encoded first bit sequence; the second encoding module 42 linearly combines at least two bit sequence segments in the first bit sequence to obtain a second bit sequence; the third encoding module 44 cascades the first bit sequence and the second bit sequence to obtain a target bit sequence having a code rate $R_2$. The above technical solution can solve the problem in the related art that low code rate LDPC encoding will increase the decoding delay and hardware complexity of the decoder, and can thus achieve an effect that the decoding delay and hardware complexity of the decoder won't be increased while obtaining a LDPC encoding of a low code rate.

In an exemplary implementation of the embodiment, the second encoding module is further configured to divide the first bit sequence into t bit sequence segments, where there is a relationship between the number t of the bit sequence segments and the code rate $R_1$ as follows:

$$t = \left[\!\left[ \frac{j}{R_1} \right]\!\right],$$

where t is a positive integer greater than or equal to 1, j is a positive integer, and the operator $[\![\cdot]\!]$ represents rounding up, rounding down, or rounding operation.

Figure 5:
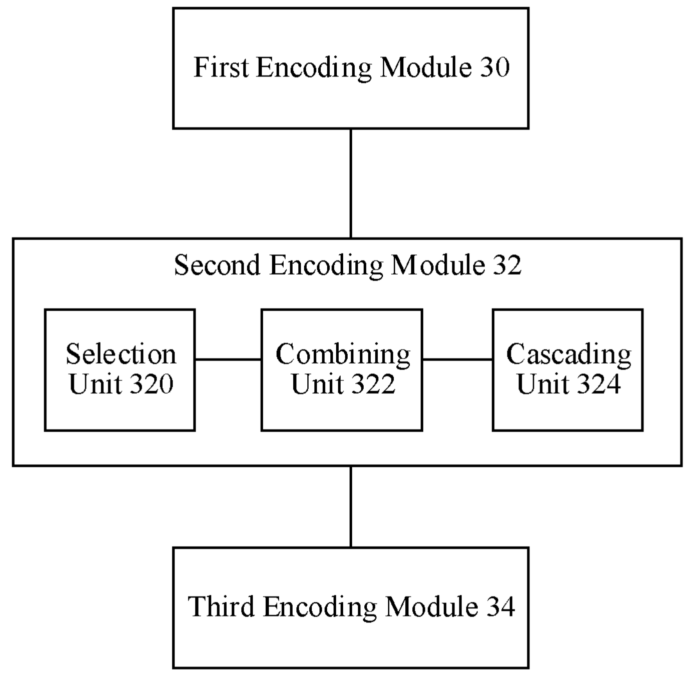
FIG. 5 is a second block diagram showing the structure of an encoding device according to the second embodiment of the present disclosure.

FIG. 5 is a second block diagram showing the structure of an encoding device according to the second embodiment of the present disclosure. As shown in FIG. 5, in an exemplary implementation of the embodiment, the second encoding module 32 includes the following units.

A selection unit 420 is configured to select $t_1$ bit sequence segments from t bit sequence segments of the first bit sequence.

A combining unit 422 is configured to linearly combine bits at corresponding positions in the $t_1$ bit sequence segments to obtain a bit sequence segment $D_1$, where $1 < t_1 \le t$.

A cascading unit 424 is configured to cascade the w bit sequence segments $\{D_1, D_2, \ldots, D_w\}$ generated by the selection unit and the combining unit to obtain the second bit sequence, where w is a positive integer.

It should be noted that the linear combination of the bits at the corresponding positions in the $t_1$ bit sequence segments in the determining step may be implemented by any of the following manners:

performing binary addition of the bits at corresponding positions in the $t_1$ bit sequence segments; or first performing interleaving on at least two bit sequence segments of the $t_1$ bit sequence segments, and then performing binary addition of the bits at corresponding positions in the $t_1$ bit sequence segments.

However, the linear combination of the bits in the corresponding positions in the bit sequence segment can be implemented by other manners. Any equivalent substitution or extension on the basis of the embodiment is within the protection scope of the embodiment, which is not limited in the embodiment.

In another exemplary embodiment of the present disclosure, how to select $t_1$ bit sequence segments and which bit sequence segments are selected from the t bit sequence segments of the first bit sequence are specifically described, including but not limited to the following manners.

The selection may be performed according to a predetermined rule between the encoding end and the decoding end, or may be performed according to an indication in a signal sent from the encoding end to the decoding end, or may be performed according to an indication in a signal sent from the decoding end to the encoding end.

The number w of bit sequence segments mentioned in the embodiment is determined according to t, $R_1$, and $R_2$. It may be determined according to the following formula:

$$w = \left[\!\left[ t \cdot \left( \frac{R_1}{R_2} - 1 \right) \right]\!\right],$$

where, the operator $[\![\cdot]\!]$ represents a rounding operation.

The bit length $L_2$ of the second bit sequence mentioned in this embodiment is determined according to $L_1$, $R_1$, and $R_2$, and is specifically determined according to the following formula:

$$L_2 = \left[\!\left[ L_1 \cdot \left( \frac{R_1}{R_2} - 1 \right) \right]\!\right],$$

where $L_1$ denotes the bit length of the first bit sequence, and the operator $[\![\cdot]\!]$ represents a rounding operation.

In an exemplary implementation of the embodiment, an encoding device is also provided, including the following modules.

A fourth encoding module is configured to encode a bit sequence O to be decoded with an LDPC code having a code rate of 1/3 to obtain an encoded bit sequence P.

A dividing module is configured to divide the bit sequence P into three bit sequence segments {P1, P2, P3}.

A fifth encoding module is configured to linearly combine the bit sequence segments P1 and P2, and linearly combine the bit sequence segments P1 and P3 to obtain a bit sequence Q.

A sixth encoding module is configured to cascade the bit sequence P and the bit sequence Q to obtain a bit sequence S having a code rate of 1/5.

Figure 6:
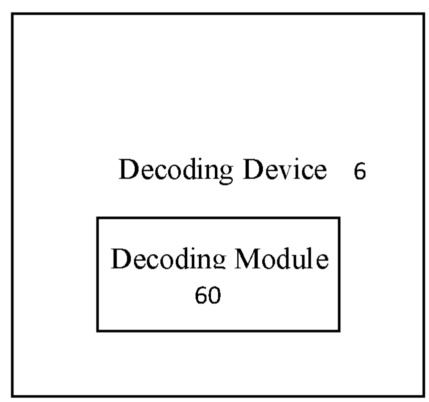
FIG. 6 is a block diagram showing the structure of a decoding device according to the second embodiment of the present disclosure.

In order to better understand the present disclosure, this embodiment also provides a decoding device. FIG. 6 is a block diagram showing the structure of a decoding device according to the second embodiment of the present disclosure. As shown in FIG. 6, the decoding device 6 includes the following modules.

A decoding module 60 is configured to decode a target bit sequence having a code rate $R_2$ with a low density parity check code LDPC having a code rate $R_1$, to obtain an initial bit sequence to be encoded, where $0 \le R_2 \le R_1 \le 1$, wherein the target bit sequence is formed by cascading a first bit sequence and a second bit sequence;

the first bit sequence is obtained by encoding an initial bit sequence to be encoded with a LDPC having a code rate $R_1$; and the second bit sequence is obtained by linearly combining at least two bit sequence segments in the first bit sequence.

Through the above device, the decoding module decodes a target bit sequence having a code rate $R_2$ with a low density parity check code LDPC having a code rate $R_1$, to obtain an initial bit sequence to be encoded, where the target bit sequence is formed by cascading a first bit sequence and a second bit sequence; the first bit sequence is obtained by encoding an initial bit sequence to be encoded with a LDPC having a code rate $R_1$; and the second bit sequence is obtained by linearly combining at least two bit sequence segments in the first bit sequence. The above technical solution can solve the problem in the related art that low code rate LDPC encoding will increase the decoding delay and hardware complexity of the decoder, and can thus achieve an effect that the decoding delay and hardware complexity of the decoder won't be increased while obtaining a LDPC encoding of a low code rate.

It should be noted that the entities to which the various modules and units in the above embodiments of the present disclosure may be applied to entities including at least an encoder or a decoder, and the above modules may be implemented in software or hardware. For the latter, the following implementation may be, but not limited to: the above modules are all located in the same processor (the processor is located in the above encoder or decoder); or, the above modules are respectively located in different processors in any combination.

Third Embodiment

Figure 7:
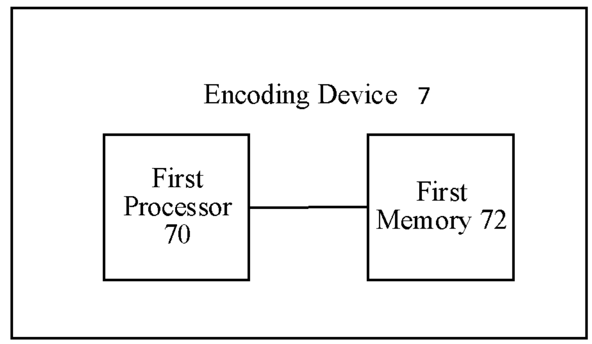
FIG. 7 is a block diagram showing the structure of an encoding device according to a third embodiment of the present disclosure.

In order to better understand the technical solutions of the above embodiments of the present disclosure, an embodiment of the present disclosure further provides a physical encoding device. FIG. 7 is a block diagram showing the structure of an encoding device 7 according to a third embodiment of the present disclosure. As shown in FIG. 7, the physical encoding device 7 includes a first processor 70 and a first memory 72 for storing instructions executable by the first processor 70, and when the instructions are executed by the first processor 70, the following operations are performed:

encoding an initial bit sequence to be encoded with a low density parity check code LDPC having a code rate $R_1$, to obtain an encoded first bit sequence, where $0 \le R_1 \le 1$;

linearly combining at least two bit sequence segments in the first bit sequence to obtain a second bit sequence; and cascading the first bit sequence and the second bit sequence to obtain a target bit sequence having a code rate $R_2$, where $0 \le R_2 \le R_1 \le 1$.

Through the encoding device, the first processor 70 encodes an initial bit sequence to be encoded with a low density parity check code LDPC having a code rate $R_1$, to obtain an encoded first bit sequence, where $0 \le R_1 \le 1$; combines at least two bit sequence segments in the first bit sequence linearly to obtain a second bit sequence; and cascades the first bit sequence and the second bit sequence to obtain a target bit sequence having a code rate $R_2$. The above technical solution can solve the problem in the related art that low code rate LDPC encoding will increase the decoding delay and hardware complexity of the decoder, and can thus achieve an effect that the decoding delay and hardware complexity of the decoder won't be increased while obtaining a LDPC encoding of a low code rate.

In an exemplary implementation of the embodiment of the present disclosure, before at least two bit sequence segments in the first bit sequence are combined linearly to obtain a second bit sequence, the first processor is further configured to perform:

dividing the first bit sequence into t bit sequence segments, where there is a relationship between the number t of the bit sequence segments and the code rate $R_1$ as follows:

$$t = \left[\!\left[ \frac{j}{R_1} \right]\!\right],$$

where t is a positive integer greater than or equal to 1, j is a positive integer, and the operator $[\![\cdot]\!]$ represents a rounding operation.

Preferably, the first processor is further configured to perform the following operations:

a selecting step of selecting $t_1$ bit sequence segments from t bit sequence segments;

a combining step of: linearly combining bits at corresponding positions in the $t_1$ bit sequence segments to obtain a bit sequence segment $D_1$, where $1 < t_1 \le t$;

repeating the above selecting step and combining step to generate w bit sequence segments $\{D_1, D_2, \ldots, D_w\}$, where w is a positive integer; and cascading the w bit sequence segments to obtain the second bit sequence.

Preferably, linearly combining the bits at the corresponding positions in the $t_1$ bit sequence segments includes at least one of the following:

performing binary addition of the bits at corresponding positions in the $t_1$ bit sequence segments; and first performing interleaving on at least two bit sequence segments of the $t_1$ bit sequence segments, and then performing binary addition of the bits at corresponding positions in the $t_1$ bit sequence segments.

Preferably, the first processor selecting t1 bit sequence segments from the t bit sequence segments of the first bit sequence includes an operation of at least one of the following:

performing selection according to a pre-determined rule between the encoding end and the decoding end;

performing selection according to an indication in a signal sent from the encoding end to the decoding end; and performing selection according to an indication in a signal sent from the decoding end to the encoding end.

Preferably, the number w of the bit sequence segments is determined according tot, $R_1$, $R_2$.

Preferably, the number w of bit sequence segments of the second bit sequence is determined according to the following formula:

$$w = \left[\!\left[ t \cdot \left( \frac{R_1}{R_2} - 1 \right) \right]\!\right],$$

where, the operator $[\![\cdot]\!]$ represents a rounding operation.

Preferably, the bit length $L_2$ of the second bit sequence is determined according to $L_1$, $R_1$, and $R_2$, where $L_1$ denotes the bit length of the first bit sequence.

Preferably, the bit length $L_2$ of the second bit sequence is determined according to the following formula:

$$L_2 = \left[\!\left[ L_1 \cdot \left( \frac{R_1}{R_2} - 1 \right) \right]\!\right],$$

where, the operator $[\![\cdot]\!]$ represents a rounding operation.

Preferably, when $R_1=1/3$, $R_2=1/5$, and the first bit sequence includes three bit sequence segments {P1, P2, P3}, the method further includes:

linearly combining the bit sequence segments P1 and P2, and linearly combining the bit sequence segments P1 and P3 to obtain a second bit sequence; and cascading the first bit sequence and the second bit sequence to obtain a target bit sequence having a code rate $R_2=1/5$.

Figure 8:
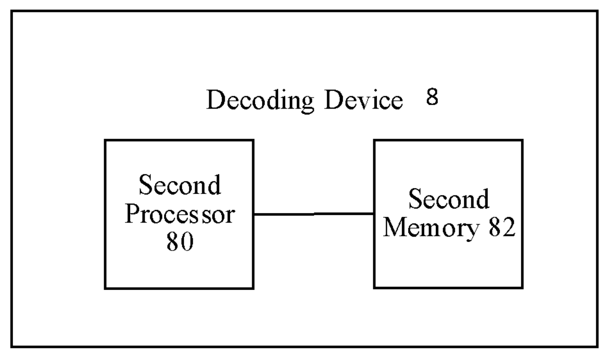
FIG. 8 is a block diagram showing the structure of a decoding device according to the third embodiment of the present disclosure.

In order to better understand the technical solution of the above embodiments of the present disclosure, an embodiment of the present disclosure further provides a physical decoding device. FIG. 8 is a block diagram showing the structure of a decoding device according to the third embodiment of the present disclosure. As shown in FIG. 8, the decoding device 8 of this embodiment includes: a second processor 80 and a second memory 82 configured to store instructions executable by the second processor 80, and when the instructions are executed by the second processor 80, the following operations are performed:

decoding a target bit sequence having a code rate $R_2$ with a low density parity check code LDPC having a code rate $R_1$, to obtain an initial bit sequence to be encoded, where $0 \le R_2 \le R_1 \le 1$. The target bit sequence is formed by cascading a first bit sequence and a second bit sequence. The first bit sequence is obtained by encoding an initial bit sequence to be encoded with a LDPC having a code rate $R_1$. The second bit sequence is obtained by linearly combining at least two bit sequence segments in the first bit sequence.

Through the above decoding device, the second processor 80 decodes a target bit sequence having a code rate $R_2$ with a low density parity check code LDPC having a code rate $R_1$, to obtain an initial bit sequence to be encoded, where $0 \le R_2 \le R_1 \le 1$. The target bit sequence is formed by cascading a first bit sequence and a second bit sequence. The first bit sequence is obtained by encoding an initial bit sequence to be encoded with a LDPC having a code rate $R_1$. The second bit sequence is obtained by linearly combining at least two bit sequence segments in the first bit sequence. The above technical solution can solve the problem in the related art that low code rate LDPC encoding will increase the decoding delay and hardware complexity of the decoder, and can thus achieve an effect that the decoding delay and hardware complexity of the decoder won't be increased while obtaining a LDPC encoding of a low code rate.

It should be noted that the physical encoding device and the physical decoding device may be a processing device such as a chip or a single chip, or may be a physical device such as an encoder or a decoder, and embodiments of the present disclosure do not impose specific limitations on this.

For a better understanding of the present disclosure, some exemplary embodiments are provided.

Exemplary Embodiment 1

In the embodiment of the present disclosure, an encoding method of a low density parity check code is provided. The method includes the following steps.

In step 1, a first bit sequence I to be decoded (equivalent to the initial bit sequence in the above embodiments) is encoded with a low density parity check code having a code rate $R_1$ to obtain an encoded second bit sequence C (equivalent to the first bit sequence in the above embodiments), wherein $0 \le R_1 \le 1$.

In step 2, all or part of the bit sequence segments of the second bit sequence C are linearly combined to obtain a third bit sequence D (equivalent to the second bit sequence in the above embodiments).

In step 3, the second bit sequence C and the third bit sequence D are cascaded to form a fourth bit sequence E (corresponding to the target bit sequence in the above embodiments) having a code rate $R_2$, where $0 \le R_2 \le R_1 \le 1$.

All or part of the bit sequence segments of the second bit sequence C means that the second bit sequence C can be divided into t bit sequence segments $\{C_1, C_2, \ldots, C_t\}$, and there is a relationship between the number t of the bit sequence segments and the code rate $R_1$ as follows:

$$t = \left[\!\left[ \frac{j}{R_1} \right]\!\right],$$

where j is a positive integer, and the operator $[\![\cdot]\!]$ represents a rounding operation such as rounding up, rounding down, and so on.

The method for linearly combining all or part of the bit sequences of the second bit sequence C to obtain the third bit sequence D includes:

selecting $t_1$ bit sequence segments from t bit sequence segments $\{C_1, C_2, \ldots C_t\}$ of the second bit sequence C, and linearly combining the bits at corresponding positions in the $t_1$ bit sequence segments to obtain a new bit sequence segment $D_1$, where $t_1 \le t$; selecting $t_2$ bit sequence segments from t bit sequence segments $\{C_1, C_2, \ldots C_t\}$, and linearly combining the bits at corresponding positions in the $t_2$ bit sequence segments to obtain a new bit sequence segment $D_2$, where $t_2 \le t$; and so on, until w new bit sequence segments $\{D_1, D_2, \ldots, D_w\}$ are generated. The w new bit sequence segments are cascaded to obtain a third bit sequence D.

Further, linearly combining the bits at corresponding positions in the plurality of bit sequence segments means performing binary addition (also referred to as "exclusive OR") on the plurality of bits; or interleaving part of the bit sequence segments, and then performing binary addition (exclusive OR) on bits at the corresponding positions in the plurality of bit sequence segments.

Further, the $t_i$ (where $1 \le i \le w$) bit sequence segments for generating a new bit sequence segment $D_1$ may be pre-agreed between the transmitting end and the receiving end, or notified to the receiving end by the transmitting end; or notified to the transmitting end by the receiving end.

Further, the number w of bit sequence segments of the third bit sequence D can be determined by the target code rate $R_2$. Specifically, $$w = \left\llbracket t \cdot \left(\frac{R_1}{R_2} - 1\right) \right\rrbracket,$$

where $R_1$ is the encoding rate of the second bit sequence C, t is the number of bit sequence segments of the second bit sequence C, and the operator $\llbracket \cdot \rrbracket$ represents a rounding operation such as rounding up, rounding down, and so on.

Further, the length $L_2$ (bit) of the third bit sequence D can be determined by the target code rate $R_2$. Specifically $$L_2 = \left\llbracket L_1 \cdot \left(\frac{R_1}{R_2} - 1\right) \right\rrbracket,$$

where $R_1$ is the encoding rate of the second bit sequence C, $L_1$ is the length (bit) of the second bit sequence C, and the operator $\llbracket \cdot \rrbracket$ represents rounding up, rounding down, or rounding operation.

Exemplary Embodiment 2

Figure 9:
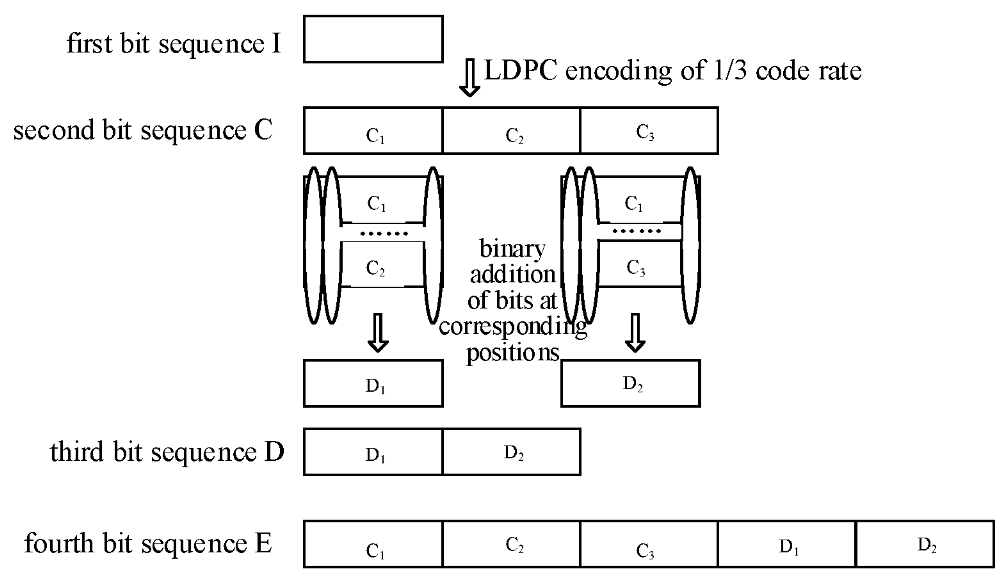
FIG. 9 is a schematic diagram of an encoding method according to an exemplary embodiment 2 of the present disclosure.

FIG. 9 is a schematic diagram of an encoding method according to an exemplary embodiment 2 of the present disclosure. As shown in FIG. 9, for a low density parity check code having a code rate $R_1$, a low density parity check code having a code rate $R_2$ can be obtained by the following method. In this embodiment, it is assumed that $R_1=1/3$, $R_2=1/5$.

For a first bit sequence I to be decoded, assuming that the length of the first bit sequence I is 1000 bits, the first bit sequence I to be decoded is encoded with a parity check matrix or a base matrix (for example, basic check matrix of 16 rows and 24 columns) of a low density parity check code having a code rate of $R_1=1/3$, to generate a second bit sequence C. The length of the second bit sequence C is $L_1=3000$ bits. The second bit sequence C can be divided into a number t of bit sequence segments:

$$t = \left\llbracket \frac{j}{R_1} \right\rrbracket = 3$$

i.e., bit sequence segments $\{C_1, C_2, C_3\}$, where j has the value j=1. $C_1$ is an information bit sequence segment, $C_2$ and $C_3$ are check bit sequence segments. Each of the lengths of $C_1$, $C_2$, and $C_3$ is 1000 bits.

Part or all of the bit sequence segments in the second bit sequence C are linearly combined to obtain a third bit sequence D. The third bit sequence D includes a number w of bit sequence segments:

$$w = \left\llbracket t \cdot \left(\frac{R_1}{R_2} - 1\right) \right\rrbracket = 2$$

i.e., bit sequence segments $\{D_1, D_2\}$, each bit sequence segment having a length of 1000 bits. And the length of the third bit sequence D is 2000 bits:

$$L_2 = \left\llbracket L_1 \cdot \left(\frac{R_1}{R_2} - 1\right) \right\rrbracket = 2000.$$

Specifically, $t_1=2$ bit sequence segments $C_1$ and $C_2$ are selected from t=3 bit sequence segments $\{C_1, C_2, C_3\}$ of the second bit sequence C according to a pre-agreed rule between the transmitting end and the receiving end. $C_1$ is an information bit sequence segment, and $C_2$ is a check bit sequence segment. Binary addition is performed on bits at corresponding positions of the two bit sequence segments to obtain a new bit sequence segment $D_1$. $t_2=2$ bit sequence segments $C_1$ and $C_3$ are selected from t=3 bit sequence segments $\{C_1, C_2, C_3\}$, of which $C_1$ is an information bit sequence segment and $C_3$ is a check bit sequence segment. Binary addition is performed on bits at corresponding positions of the two bit sequence segments to obtain a new bit sequence segment $D_2$. The new bit sequences $D_1$ and $D_2$ are cascaded to obtain a third bit sequence $D=\{D_1, D_2\}$.

The second bit sequence C and the third bit sequence D are cascaded to obtain a fourth bit sequence $E=\{C, D\}$ having an encoding rate $R_2=1/5$.

Exemplary Embodiment 3

Figure 10:
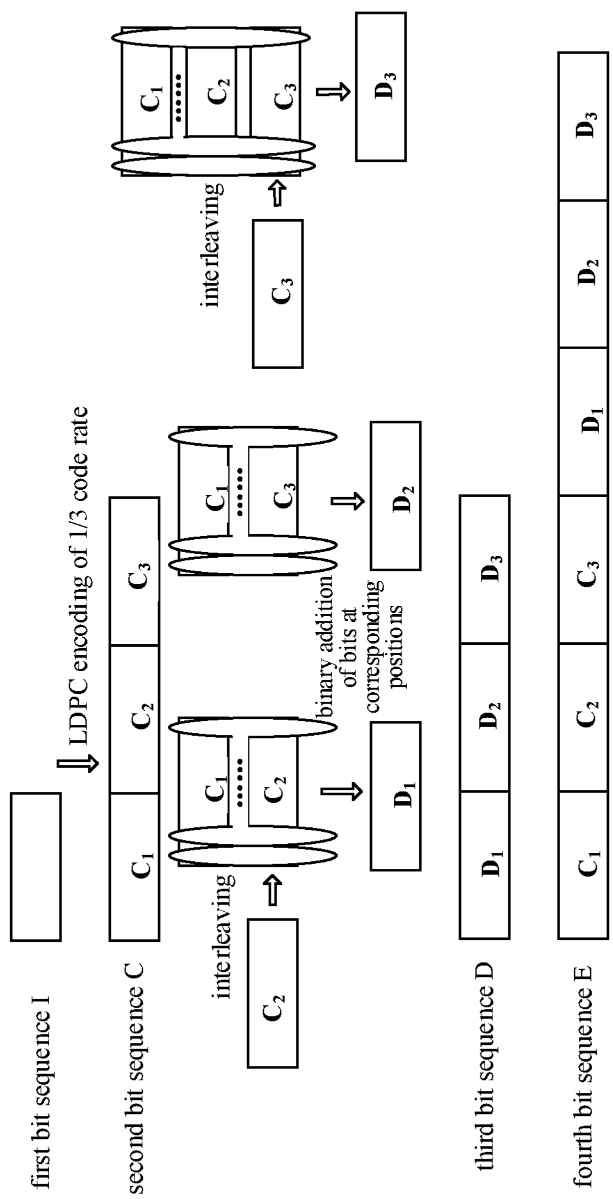
FIG. 10 is a schematic diagram of an encoding method according to an exemplary embodiment 3 of the present disclosure.

FIG. 10 is a schematic diagram of an encoding method according to an exemplary embodiment 3 of the present disclosure. As shown in FIG. 10, for a low density parity check code having a code rate $R_1$, a low density parity check code having a code rate $R_2$ can be obtained by the following method. In this embodiment, it is assumed that $R_1=1/3$, $R_2=1/6$.

For a first bit sequence I to be decoded, assuming that the length of the first bit sequence I is 1000 bits, the first bit sequence I to be decoded is encoded with a parity check matrix or a base matrix (for example, basic check matrix of 16 rows and 24 columns) of a low density parity check code having a code rate of $R_1=1/3$, to generate a second bit sequence C. The length of the second bit sequence C is $L_1=3000$ bits. The second bit sequence C can be divided into a number t of bit sequence segments:

$$t = \left\llbracket \frac{j}{R_1} \right\rrbracket = 3$$

i.e., bit sequence segments $\{C_1, C_2, C_3\}$, where j has the value j=1. $C_1$ is an information bit sequence segment, $C_2$ and $C_3$ are check bit sequence segments. Each of the lengths of $C_1$, $C_2$, and $C_3$ is 1000 bits.

Part or all of the bit sequence segments in the second bit sequence C are linearly combined to obtain a third bit sequence D. The third bit sequence D includes a number w of bit sequence segments:

$$w = \left[\left[ t \cdot \left( \frac{R_1}{R_2} - 1 \right) \right]\right] = 3$$

i.e., bit sequence segments $\{D_1, D_2, D_3\}$, each bit sequence segment having a length of 1000 bits. And the length of the third bit sequence D is 3000 bits:

$$L_2 = \left[\left[ L_1 \cdot \left( \frac{R_1}{R_2} - 1 \right) \right]\right] = 3000.$$

Specifically, $t_1=2$ bit sequence segments $C_1$ and $C_2$ are selected from t=3 bit sequence segments $\{C_1, C_2, C_3\}$ of the second bit sequence C according to a previously agreed rule between the transmitting end and the receiving end. $C_1$ is an information bit sequence segment, and $C_2$ is a check bit sequence segment. The bit sequence segment $C_2$ of the 2 bit sequence segments is interleaved, and binary addition is performed on bits at corresponding positions of the two bit sequence segments (including interleaved bit sequence segment $C_2$ and un-interleaved bit sequence segment $C_1$) to obtain a new bit sequence segment $D_1$. $t_2=2$ bit sequence segments $C_1$ and $C_3$ are selected from t=3 bit sequence segments $\{C_1, C_2, C_3\}$, of which $C_1$ is an information bit sequence segment and $C_3$ is a check bit sequence segment. Binary addition is performed on bits at corresponding positions of the two bit sequence segments to obtain a new bit sequence segment $D_2$. $t_3=3$ bit sequence segments $C_1$, $C_2$, and $C_3$ are selected from t=3 bit sequence segments $\{C_1, C_2, C_3\}$ of the second bit sequence C, of which $C_1$ is an information bit sequence segment, $C_2$ and $C_3$ are check bit sequence segments. The bit sequence segment $C_3$ of the three bit sequence segments is interleaved, and binary addition is performed on bits at corresponding positions of the three bit sequence segments (including interleaved bit sequence segment $C_3$ and un-interleaved bit sequence segments $C_1$ and $C_2$) to obtain a new bit sequence segment $D_3$. The new bit sequences $D_1$, $D_2$ and $D_3$ are cascaded to obtain a third bit sequence $D=\{D_1, D_2, D_3\}$.

The second bit sequence C and the third bit sequence D are cascaded to obtain a fourth bit sequence E={C, D} having an encoding rate $R_2=1/6$.

Exemplary Embodiment 4

Figure 11:
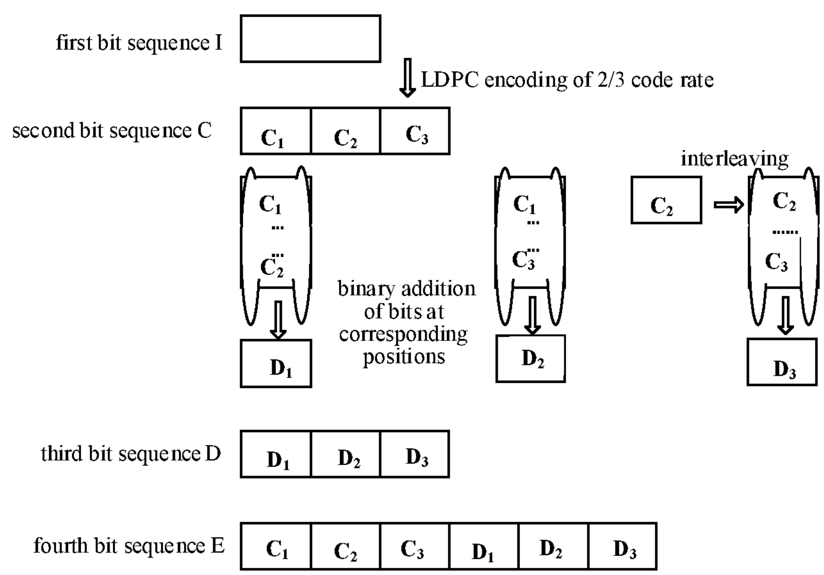
FIG. 11 is a schematic diagram of an encoding method according to an exemplary embodiment 4 of the present disclosure.

FIG. 11 is a schematic diagram of an encoding method according to an exemplary embodiment 4 of the present disclosure. As shown in FIG. 11, for a low density parity check code having a code rate $R_1$, a low density parity check code having a code rate $R_2$ can be obtained by the following method. In this embodiment, it is assumed that $R_1=2/3$, $R_2=1/3$.

For a first bit sequence I to be decoded, assuming that the length of the first bit sequence I is 1000 bits, the first bit sequence I to be decoded is encoded with a parity check matrix or a base matrix (for example, basic check matrix of 4 rows and 12 columns) of a low density parity check code having a code rate of $R_1=2/3$, to generate a second bit sequence C. The length of the second bit sequence C is $L_1=1500$ bits. The second bit sequence C can be divided into a number t of bit sequence segments:

$$t = \left[\left[ \frac{j}{R_1} \right]\right] = 3$$

i.e., bit sequence segments $\{C_1, C_2, C_3\}$, where j has the value j=2. $C_1$ and $C_2$ are information bit sequence segments, and $C_3$ is a check bit sequence segment. Each of the lengths of $C_1$, $C_2$, and $C_3$ is 500 bits.

Part or all of the bit sequence segments in the second bit sequence C are linearly combined to obtain a third bit sequence D. The third bit sequence D includes a number w of bit sequence segments:

$$w = \left[\left[ t \cdot \left( \frac{R_1}{R_2} - 1 \right) \right]\right] = 3$$

i.e., bit sequence segments $\{D_1, D_2, D_3\}$, each bit sequence segment having a length of 500 bits. And the length of the third bit sequence D is 2000 bits:

$$L_2 = \left[\left[ L_1 \cdot \left( \frac{R_1}{R_2} - 1 \right) \right]\right] = 2000.$$

Specifically, $t_1=2$ bit sequence segments $C_1$ and $C_2$ are selected from t=–3 bit sequence segments $\{C_1, C_2, C_3\}$ of the second bit sequence C according to a pre-agreed rule between the transmitting end and the receiving end. $C_1$ is an information bit sequence segment, and $C_2$ is a check bit sequence segment. Binary addition is performed on bits at corresponding positions of the two bit sequence segments to obtain a new bit sequence segment $D_1$. $t_2=2$ bit sequence segments $C_1$ and $C_3$ are selected from t=3 bit sequence segments $\{C_1, C_2, C_3\}$, of which $C_1$ is an information bit sequence segment and $C_3$ is a check bit sequence segment. Binary addition is performed on bits at corresponding positions of the two bit sequence segments to obtain a new bit sequence segment $D_2$. $t_3=2$ bit sequence segments $C_2$ and $C_3$ are selected from t=3 bit sequence segments $\{C_1, C_2, C_3\}$ of the second bit sequence C, of which $C_2$ and $C_3$ are check bit sequence segments. The bit sequence segment $C_3$ of the two bit sequence segments is interleaved, and binary addition is performed on bits at corresponding positions of the two bit sequence segments (including interleaved bit sequence segment $C_3$ and un-interleaved bit sequence segment $C_2$) to obtain a new bit sequence segment $D_3$. The new bit sequences $D_1$, $D_2$ and $D_3$ are cascaded to obtain a third bit sequence $D=\{D_1, D_2, D_3\}$.

The second bit sequence C and the third bit sequence D are cascaded to obtain a fourth bit sequence E={C, D} having an encoding rate $R_2=1/3$.

Fourth Embodiment

An embodiment of the present disclosure also provides a storage medium. Optionally, in this embodiment, the storage medium may be configured to store program codes executed as the encoding method and the decoding method provided in the first embodiment described above.

Optionally, in this embodiment, the storage medium may be located in any one computer terminal of the computer terminal groups in the computer network, or in any one mobile terminal of the mobile terminal groups.

Optionally, in the embodiment, the storage medium is configured to store program codes for performing the following steps:

S1, encoding an initial bit sequence to be encoded with a low density parity check code LDPC having a code rate $R_1$, to obtain an encoded first bit sequence, where $0 \le R_1 \le 1$;

S2, linearly combining at least two bit sequence segments in the first bit sequence to obtain a second bit sequence; and S3, cascading the first bit sequence and the second bit sequence to obtain a target bit sequence having a code rate $R_2$, where $0 \le R_2 \le R_1 \le 1$.

An embodiment of the present disclosure also provides a storage medium. Optionally, in this embodiment, the storage medium may be configured to store program codes for performing the following steps:

S1, decoding a target bit sequence having a code rate $R_2$ with a low density parity check code LDPC having a code rate $R_1$, to obtain an initial bit sequence to be encoded, where $0 \le R_2 \le R_1 \le 1$; and the target bit sequence is formed by cascading a first bit sequence and a second bit sequence;

the first bit sequence is obtained by encoding an initial bit sequence to be encoded with a LDPC having a code rate $R_1$; and the second bit sequence is obtained by linearly combining at least two bit sequence segments in the first bit sequence.

The serial numbers of the embodiments of the present disclosure are merely for description, and do not represent the advantages and disadvantages of the embodiments.

In the above mentioned embodiments of the present disclosure, the descriptions of the various embodiments are different, and the parts that are not described in detail in one embodiment can be referred to the related descriptions of other embodiments.

In the several embodiments provided by the present application, it should be understood that the disclosed technical contents may be implemented in other manners. The device embodiments described above are merely illustrative. For example, the division of the units is only a logical function division. In actual implementation, there may be another division manner. For example, a plurality of units or components may be combined or may be integrate into another system, or some features can be ignored or not executed. In addition, the mutual coupling or direct coupling or communication connection shown or discussed may be an indirect coupling or communication connection through some interfaces, units or modules, and may be electrical or in other forms.

The units described as separate components may or may not be physically separated, and the components displayed as units may or may not be physical units, that is, may be located in one place, or may be distributed over a plurality network units. Some or all of the units may be selected according to actual needs to achieve the purpose of the solution of the embodiment.

In addition, each functional unit in each embodiment of the present disclosure may be integrated into one processing unit, or each unit may exist physically separately, or two or more units may be integrated into one unit. The above integrated unit can be implemented in the form of hardware or in the form of a software functional unit.

The integrated units, if implemented in the form of a software functional unit and sold or used as a standalone product, may be stored in a computer readable storage medium. Based on such understanding, the essence or the part contributing to the prior art of the technical solutions of the present disclosure may be embodied in the form of a software product stored in a storage medium. A number of instructions are included to cause a computer device (which may be a personal computer, server or network device, etc.) to perform all or part of the steps of the methods described in various embodiments of the present disclosure. The storage medium includes: a U disk, a Read-Only Memory (ROM), a Random Access Memory (RAM), a removable hard disk, a magnetic disk, or an optical disk, and the like.

The above description is only exemplary embodiments of the present disclosure, and is not intended to limit the present disclosure, and various modifications and changes can be made by those skilled in the art to the present disclosure. Any modifications, equivalent substitutions, improvements, etc. made within the spirit and scope of the present disclosure are intended to be included within the scope of the present disclosure.

INDUSTRIAL APPLICABILITY

In the technical solution provided by the embodiments of the present disclosure, the initial bit sequence is encoded with the LDPC of a low code rate $R_1$, to obtain a first bit sequence, and the first bit sequence is segmented. Then, at least two bit sequence segments in the first bit sequence are combined linearly to obtain a second bit sequence. The first bit sequence and the second bit sequence are cascaded to obtain a target bit sequence of a lower code rate $R_2$, where $0 \le R_2 \le R_1 \le 1$. In this way, the code rate during the transmission of the target bit sequence is the relatively low code rate $R_2$, and this can ensure the propagation speed. In the decoding stage, since the target bit sequence is obtained by cascading the first bit sequence and the second bit sequence, the decoder can directly decode with the LDPC of the code rate $R_1$. Therefore, the present disclosure can solve the problem in the related art that low code rate LDPC encoding will increase the decoding delay and hardware complexity of the decoder, and can thus achieve an effect that the decoding delay and hardware complexity of the decoder won't be increased while obtaining a LDPC encoding of a low code rate.

What is claimed is:

1. An encoding method comprising:

encoding an initial bit sequence to be encoded with a low density parity check code LDPC having a code rate $R_1$, to obtain a first bit sequence, where $0 \le R_1 \le 1$;

dividing the first bit sequence into t bit sequence segments, wherein a relationship exists between the number t of the bit sequence segments and the code rate $R_1$:

$$t = [[\frac{j}{R_1}]],$$

where t is a positive integer greater than or equal to 1, j is a positive integer, and the operator $[[\cdot]]$ represents a rounding operation;

linearly combining at least two bit sequence segments in the first bit sequence to obtain a second bit sequence, wherein linearly combining at least two bit sequence segments in the first bit sequence to obtain a second bit sequence comprises: a selecting step of selecting $t_1$ bit sequence segments from t bit sequence segments; a combining step of linearly combining bits at corresponding positions in the $t_1$ bit sequence segments to obtain a bit sequence segment $D_1$, where $1 < t_1 \le t$; repeating the selecting step and the combining step to generate w bit sequence segments $\{D_1, D_2, \ldots, D_w\}$, where w is a positive integer; and cascading the w bit sequence segments to obtain the second bit sequence; and cascading the first bit sequence and the second bit sequence to obtain a target bit sequence having a code rate $R_2$, where $0 \leq R_2 \leq R_1 \leq 1$.

2. The method according to claim 1, wherein linearly combining bits at corresponding positions in the $t_1$ bit sequence segments comprises at least one of:

performing binary addition of bits at corresponding positions in the $t_1$ bit sequence segments; and first performing interleaving on at least two bit sequence segments of the $t_1$ bit sequence segments, and then performing binary addition of bits at corresponding positions in the $t_1$ bit sequence segments.

3. The method according to claim 1, wherein selecting $t_1$ bit sequence segments from t bit sequence segments comprises at least one of:

performing selection according to a pre-determined rule between an encoding end and a decoding end;

performing selection according to an indication in a signal sent from the encoding end to the decoding end; and performing selection according to an indication in a signal sent from the decoding end to the encoding end.

4. The method according to claim 1, wherein the number w of bit sequence segments is determined according to t, $R_1$, and $R_2$.

5. The method according to claim 4, wherein the number w of bit sequence segments of the second bit sequence is determined according to a formula of:

$$w = \left[\left[t \cdot \left(\frac{R_1}{R_2} - 1\right)\right]\right],$$

where, the operator $[[\cdot]]$ represents a rounding operation.

6. The method according to claim 1, wherein a bit length $L_2$ of the second bit sequence is determined according to $L_1$, $R_1$, and $R_2$, wherein $L_1$ is a bit length of the first bit sequence.

7. The method according to claim 6, wherein the bit length $L_2$ of the second bit sequence is determined according to a formula of $$L_2 = \left[\left[L_1 \cdot \left(\frac{R_1}{R_2} - 1\right)\right]\right],$$

where, the operator $[[\cdot]]$ represents a rounding operation.

8. The method according to claim 1, wherein when $R_1=1/3$, $R_2=1/5$, and the first bit sequence comprises 3 bit sequence segments {P1, P2, P3}, the method further comprises:

linearly combining the bit sequence segments P1 and P2, and linearly combining the bit sequence segments P1 and P3 to obtain a second bit sequence; and cascading the first bit sequence and the second bit sequence to obtain a target bit sequence having a code rate $R_2=1/5$.

9. A decoding method comprising:

decoding a target bit sequence having a code rate $R_2$ with a low density parity check code LDPC having a code rate $R_1$, to obtain an initial bit sequence to be encoded, where $0 \leq R_2 \leq R_1 \leq 1$, wherein the target bit sequence is formed by cascading a first bit sequence and a second bit sequence, the first bit sequence is obtained by encoding an initial bit sequence to be encoded with a LDPC having a code rate $R_1$, and the second bit sequence is obtained by dividing the first bit sequence into t bit sequence segments and linearly combining at least two bit sequence segments in the first bit sequence, wherein a relationship exists between the number t of the bit sequence segments and the code rate $R_1$:

$$t = \left[\left[\frac{j}{R_1}\right]\right],$$

wherein t is a positive integer greater than or equal to 1, j is a positive integer, and the operator $[[\cdot]]$ represents a rounding operation; and linearly combining at least two bit sequence segments in the first bit sequence comprises: a selecting step of selecting $t_1$ bit sequence segments from t bit sequence segments; a combining step of linearly combining bits at corresponding positions in the $t_1$ bit sequence segments to obtain a bit sequence segment $D_1$, where $1<t_1 \leq t$; repeating the selecting step and the combining step to generate w bit sequence segments $\{D_1, D_2, \ldots, D_w\}$, where w is a positive integer; and cascading the w bit sequence segments to obtain the second bit sequence.

10. An encoding device, comprising:

a processor;

a memory for storing instructions executable by the processor;

wherein the processor is configured to:

encode an initial bit sequence to be encoded with a low density parity check code LDPC having a code rate $R_1$, to obtain a first bit sequence, where $0 \leq R_1 \leq 1$;

divide the first bit sequence into t bit sequence segments, wherein a relationship exists between the number t of the bit sequence segments and the code rate $R_1$:

$$t = \left[\left[\frac{j}{R_1}\right]\right],$$

where t is a positive integer greater than or equal to 1, j is a positive integer, and the operator $[[\cdot]]$ represents a rounding operation;

linearly combine at least two bit sequence segments in the first bit sequence to obtain a second bit sequence, wherein the processor is further configured to: select $t_1$ bit sequence segments from t bit sequence segments of the first bit sequence; linearly combine bits at corresponding positions in the $t_1$ bit sequence segments to obtain a bit sequence segment $D_1$, where $1<t_1 \leq t$; and cascade w bit sequence segments $\{D_1, D_2, \ldots, D_w\}$ generated by the selection unit and the combining unit to obtain the second bit sequence, where w is a positive integer; and cascade the first bit sequence and the second bit sequence to obtain a target bit sequence having a code rate $R_2$, where $0 \leq R_2 \leq R_1 \leq 1$.

11. The device according to claim 10, wherein the processor is further configured to perform at least one of:

performing binary addition of the bits at corresponding positions in the $t_1$ bit sequence segments; and first performing interleaving on at least two bit sequence segments of the $t_1$ bit sequence segments, and then performing binary addition of the bits at corresponding positions in the $t_1$ bit sequence segments.

12. The device according to claim 10, wherein the processor is further configured to:

according to a pre-determined rule between an encoding end and a decoding end, select $t_1$ bit sequence segments from t bit sequence segments;

according to an indication in a signal sent from the encoding end to the decoding end, select $t_1$ bit sequence segments from t bit sequence segments; and according to an indication in a signal sent from the decoding end to the encoding end, select $t_1$ bit sequence segments from t bit sequence segments.

13. The device according to claim 10, wherein the number w of bit sequence segments of the second bit sequence is determined according to t, $R_1$, and $R_2$.

14. The device according to claim 13, wherein the number w of bit sequence segments of the second bit sequence is determined according to a formula of:

$$w = \left[\left[t\cdot\left(\frac{R_1}{R_2}-1\right)\right]\right],$$

where, the operator $[\cdot]$ represents a rounding operation.

15. The device according to claim 10, wherein a bit length $L_2$ of the second bit sequence is determined according to $L_1$, $R_1$, and $R_2$, wherein $L_1$ is a bit length of the first bit sequence.

16. The device according to claim 15, wherein the bit length $L_2$ of the second bit sequence is determined according to a formula of:

$$L_2 = \left[\left[L_1\cdot\left(\frac{R_1}{R_2}-1\right)\right]\right],$$

where, the operator $[\cdot]$ represents a rounding operation.

* * * * *

UNITED STATES PATENT AND TRADEMARK OFFICE

CERTIFICATE OF CORRECTION

PATENT NO. : 11,316,534 B2
APPLICATION NO. : 16/325030
DATED : April 26, 2022
INVENTOR(S) : Jin Xu, Jun Xu and Liquang Li It is certified that error appears in the above-identified patent and that said Letters Patent is hereby corrected as shown below:

In the Specification

Column 2, Line 60 should read as follows: 128 363 443 285 315 69 473 22 -1 -1 455 0

Signed and Sealed this
Twelfth Day of July, 2022

Katherine Kelly Vidal

Katherine Kelly Vidal
*Director of the United States Patent and Trademark Office*